(12) United States Patent
O. et al.

(10) Patent No.: US 6,633,058 B1
(45) Date of Patent: Oct. 14, 2003

(54) VARIABLE RETICULATION TIME DELAY AND INTEGRATE SENSOR

(75) Inventors: Nixon O., Waterloo (CA); Suhail Agwani, Chandler, AZ (US)

(73) Assignee: Dalsa, Inc., Ontario (CA)

( * ) Notice: Subject to any disclaimer, the term of this patent is extended or adjusted under 35 U.S.C. 154(b) by 0 days.

(21) Appl. No.: 09/359,772

(22) Filed: Jul. 26, 1999

(51) Int. Cl.[7] ................ H01L 27/148; H01L 29/765
(52) U.S. Cl. ............... 257/232; 257/225; 257/231
(58) Field of Search .................... 257/225, 229, 257/231–233

(56) References Cited

U.S. PATENT DOCUMENTS

| | | | |
|---|---|---|---|
| 4,575,763 A | 3/1986 | Elabd | |
| 4,924,316 A | 5/1990 | Kobayashi et al. | |
| 5,055,921 A | 10/1991 | Usui | |
| 5,255,099 A | 10/1993 | Orihara | |
| 5,256,890 A | 10/1993 | Furukawa et al. | |
| 5,329,149 A | 7/1994 | Kawahara et al. | |
| 5,502,319 A | 3/1996 | Kim | |
| 5,723,884 A | 3/1998 | Kim | |
| 5,937,025 A | * 8/1999 | Smith | 377/63 |
| 5,982,467 A | * 11/1999 | Lee | 349/138 |

FOREIGN PATENT DOCUMENTS

| | | | |
|---|---|---|---|
| EP | 0 324 484 | 7/1989 | |
| EP | 509456 A1 | * 10/1992 | H01L/27/148 |
| JP | 2-2165 | 8/1990 | |

* cited by examiner

*Primary Examiner*—Allan R. Wilson
(74) *Attorney, Agent, or Firm*—Dorsey & Whitney LLP

(57) ABSTRACT

A TDI sensor includes a column of pixels ordered from an initial pixel to a final pixel where each pixel includes reticulated clock conductors arranged to define a reticulation area and a pixel charge handling capacity. The reticulation area of a pixel increases from the final pixel to the initial pixel, and the pixel charge handling capacity increases from the initial pixel to the final pixel. The sensor includes a first bus structure of polysilicon, where the bus structure includes register element sets and each register element set includes a plurality of clock conductors. Each register element set includes a corresponding pixel reticulation area, and the pixel reticulation area of a first register element set is unequal to a pixel reticulation area of another register element set. The sensor also includes a second bus structure of metal disposed substantially diagonally to the first bus structure. The second bus structure includes clock bus sets, and each clock bus set includes bus conductors. A first bus conductor of a first clock bus set includes parallel segments, and each parallel segment is co-parallel to the first bus structure. A first clock conductor of each register element set extends in an elongate direction and defines a predetermined clock conductor length in a direction perpendicular to the elongate direction. The first clock conductor of each register element set includes a first bridge segment having a predetermined bridge segment length in the direction perpendicular to the elongate direction, the predetermined clock conductor length being greater than the predetermined bridge segment length. A first parallel segment of the first bus conductor of each clock bus set is disposed over the first bridge segment of the first clock conductor of a corresponding set of the plurality of register element sets and connected thereto with a contact.

26 Claims, 10 Drawing Sheets

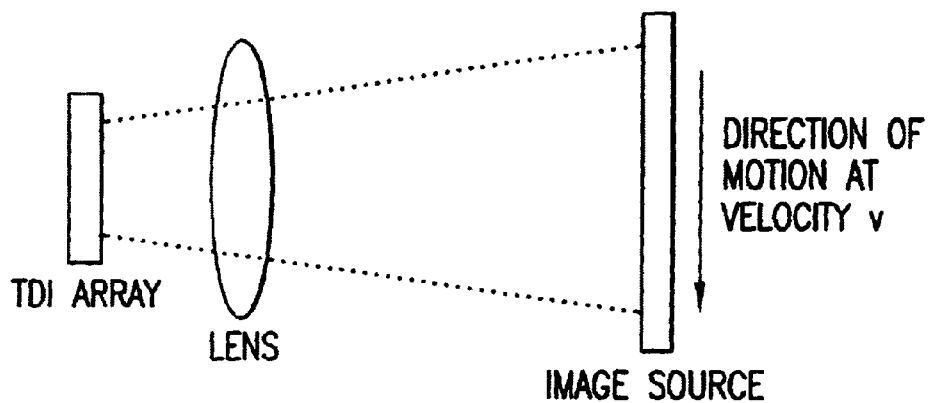
FIG.9A PRIOR ART
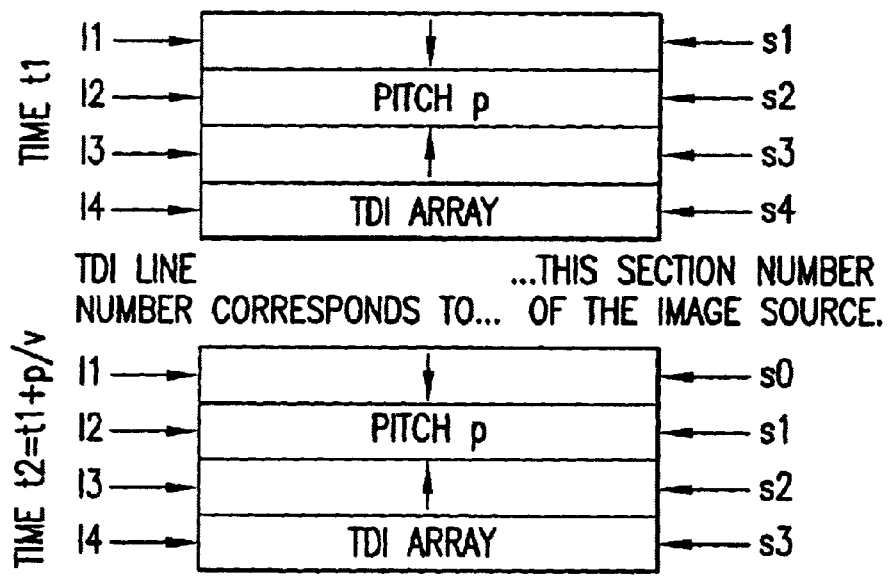
FIG.9B PRIOR ART
FIG.9C PRIOR ART

VARIABLE RETICULATION TIME DELAY AND INTEGRATE SENSOR

BACKGROUND OF THE INVENTION

1. Field of the Invention

This invention relates generally to charge coupled device image sensors and specifically to architectural implementations that enhance the short wavelength radiation response in TDI (time delay and integration) CCD sensors.

2. Description of Related Art

Charge-coupled devices (CCD) are metal insulator semiconductor (MIS) devices which belong to a general class of semiconductor devices that store and transfer information in the form of electrical charge. Charges in the CCD can either be electrically introduced, thermally generated, or photo-generated. The photosensitive property of the CCD is used in imaging applications.

There are three general classes of CCD imaging arrays: area arrays, linear arrays, and TDI (time delay and integration) arrays. An area CCD is comprised of a two-dimensional array of photoelements. Like a conventional analog camera, an area CCD captures snapshots of two-dimensional images. A linear CCD, on the other hand, is comprised of a one-dimensional array of photoelements. Linear arrays are usually used in applications where there is relative motion between the sensor and the source of the image. The linear array is oriented in the direction perpendicular to the direction of motion, and successively scans lines out of an area image. The lines can later be reconstructed to constitute the two-dimensional image. Like a linear array, a TDI array also scans successive lines of a two-dimensional image. Unlike a linear array and like an area array, however, a TDI array is comprised of a two-dimensional array of photoelements. A TDI array does not take snapshots of two-dimensional images. Instead, the vertical dimension of the TDI array is operated to transfer photogenerated charges within the array so as to follow the motion of the image source. Line outputs are then read out after the photocharges have tracked the image for some time.

The TDI concept is illustrated in FIGS. 9A, 9B and 9C. In FIG. 9A, a moving image source is projected onto a fixed TDI array. At time t1, section s1 of the two-dimensional image is imaged onto line l1 of the TDI array, while the next section, section s2, of the same two-dimensional image is imaged onto the next line, line l2, of the TDI array (see FIG. 9B). The pixel pitch of the TDI array (the center-to-center distance between l1 and l2) is denoted by p. If the image is moving relative to the TDI array at a velocity v, then at time t2 (t2=t1+p/v) section s1 will be imaged onto line l2 of the TDI array, while section s2 will be imaged onto line l3 of the TDI array (see FIG. 9C). The TDI array is clocked in a fashion such that the photogenerated charges that correspond to each section of the image follow the image along the array. Line data are read out after charges have integrated for a specified number of stages.

There are three main types of photoelements out of which such arrays are made: p-n junction photodiodes, photogates, and pinned photodiodes. A p-n junction photodiode is merely a reversed-biased p-n junction diode. In CCDs, the potential of the p side of the diode (e.g., a lightly doped p type substrate) is fixed, usually by the bias applied to the silicon substrate. The bias on the n side of the diode (e.g., an n type implant in the substrate) is either floating or is set prior to photocharge integration by an adjacent gate through which a predetermined voltage has been applied. The reversed biased diode forms a depletion layer between the p side and the n side. Photogenerated electrons are swept by an electric field in the depletion layer of the diode to the n region (due to its positive bias), where they are either temporarily stored or transferred to an adjacent gate. Photogenerated holes are usually swept to the substrate.

A photogate is essentially a sandwich comprised of an electrode layer, an insulator (e.g., silicon oxide and/or silicon nitride), and a semiconductor (e.g., lightly doped silicon). When an appropriate bias is applied to a polycrystalline silicon gate electrode (called a polysilicon gate electrode) with respect to the semiconductor, a potential well forms in the semiconductor. For example, a positive potential with respect to the semiconductor may be applied to a polysilicon gate electrode insulatively spaced over a lightly doped n type semiconductor. The positive potential repels negative charges in the conduction band of the semiconductor and induces a positive potential well beneath the gate electrode. Photogenerated charges are collected in this potential well.

In many CCDs, photogates include a doped semiconductor layer between the insulator and the semiconductor substrate. For example, an n type implant layer may be formed on a surface of a lightly doped p type semiconductor substrate. A positive potential with respect to the p type semiconductor substrate may be applied to a polysilicon gate electrode insulatively spaced over the n type implant. The positive potential induces a positive potential well beneath the gate electrode that is buried under the gate electrode so that the potential well is separated from the insulator interface by a potential barrier. Because the potential well is buried in the semiconductor, such photogates are commonly referred to as buried-channel photogates.

The maximum potential in the collecting well is a function of the gate bias. As the gate bias increases, the maximum potential in the collecting well normally also increases by approximately the same amount. In buried-channel photogates however, when the gate bias is sufficiently negative, electrons in the n implant are repelled and a layer of holes will form at the insulator-semiconductor interface. When this occurs, biasing the gate even more negatively will have virtually no effect on the collecting well potential since the layer of holes shields the electric field from the substrate. At this point, the photogate is said to be "pinned". Pinned photodiodes are similar to pinned photogates, with the exception that the layer of holes is implanted rather than induced by a gate potential.

In area and TDI CCD sensors formed with photogates, a pixel will ordinarily have two, three or four photogates architected so that the gate electrodes are coupled to respective two, three or four phase clocking signals.

The spectral response of photoelements depends on whether the photoelement is a photodiode or a photogate. In silicon based image sensors, spectral response in the silicon typically peaks at the red, yellow or green spectrum, and levels off both at the longer infrared wavelengths and at the shorter blue and ultra-violet wavelengths. FIG. 10 is a typical plot of the quantum efficiency (the proportion of photogenerated charge collected by the CCD) as a function of wavelength. Photons are absorbed in the semiconductor at a distance determined by the absorption depth in the material for given wavelength. At shorter wavelengths, most absorption occurs either close to the semiconductor surface or in overlying layers such as the polysilicon electrodes. Because most of these electrons do not reach the CCD photoelement collecting well, quantum efficiency is poorer at short wavelengths than at long wavelengths. At 400 nm, for example, the average absorption depth of photons in silicon is only 200 nm. This is thinner than the typical polysilicon layers, and as a result, the short wavelength response of photogates will suffer relative to the response achieved with photodiodes. The quantum efficiency is lower in the infrared because the energy (E=hv) of the photons tapers off at longer wavelengths. In the near infrared spectrum, some loss in quantum efficiency also occurs due to loss of electrons that are generated beyond the depletion region of the collection well. These electrons either diffuse to the substrate or recombine with holes. Silicon is mostly transparent to incoming photons with wavelengths greater than 1,100 nm.

In photogate CCDs, a large fraction of the surface of the photoelement is covered by the polysilicon layer of the photogates. Charges photogenerated by short wavelength radiation are absorbed by the polysilicon layer and do not reach the collection well. CCD arrays that use p-n junction or pinned photodiodes do not have overlying polysilicon layers over the photosensitive region and hence have better short wavelength (i.e., blue) response than photogate-based CCDs.

Area CCD sensors fall into two general categories: inter-line transfer (ILT) and frame transfer (FT) CCD sensors. FT CCD sensors generally employ photogates and ILT CCD sensors generally employ photodiodes. Hence FT CCD sensors will normally have poorer blue response than ILT CCD sensors. However, because clock and readout buses needed to reach each photodiode (e.g., for operation of transfer gates) in an ILT CCD sensor, the fill factor (the proportion of the area of each photoelement that is actually photosensitive) of an ILT CCD sensor is smaller than the fill factor of a FT CCD sensor. Consequently, the ratio of the blue to the peak response is usually better in an ILT CCD sensor than in a FT CCD sensor, but the peak response is poorer.

There are FT CCD sensors with photosensitive photoelements (i.e., pixels) that are partly comprised of photogates and partly comprised of pinned photodiodes. These usually have better blue response than FT CCD pixels that are comprised entirely of photogates. In a first variation of this part photogate and part pinned photodiode FT CCD photoelement, at least one of the photogates in each pixel is replaced by a pinned photodiode. For example, in what would ordinarily be a three phase photogate pixel (i.e., having three photogates per pixel), one of the photogates may be replaced by a pinned photodiode. In a second variation of this part photogate and part pinned photodiode FT CCD photoelement, a portion of each photogate is replaced by a pinned photodiode. In what would ordinarily be a three phase photogate pixel (i.e., having three photogates per pixel), the part of each photogate at the outside edges may be replaced with pinned photodiodes.

Linear CCD arrays generally use photodiodes (either p-n junction or pinned) as the photoelement, and hence, linear arrays generally exhibit improved blue and peak responses when compared to area type CCD sensors (both FT and ILT). However, TDI CCD sensors either use photogates exclusively or use photogates in combination with pinned photodiodes. A p-n junction photodiode is generally not used since this would complicate the process of tracking the accumulating image charges with the moving image. A TDI sensor array integrates charges for a number of stages (e.g., n stages), and therefore, the TDI sensor has an improved total response (e.g., n times greater total response when there are n stages) when compared to a similar area sensor array or a simple linear array. Since TDI photoelements are at least partly comprised of photogates, the ratio of the blue to the peak response of a single TDI stage is less than the ratio of the blue to the peak response of linear CCD sensors with a linear array of photodiodes. If the number of stages (n) is sufficiently large as is usually the case, the total response of a TDI sensor array can be made many times the total response of a linear sensor array.

In typical FT and TDI CCD sensors, the photoelements are organized in columns of channels that are separated from each other by channel stops disposed between the channels. Signal charges are transferable up and down the columns. The channel stops need to be deeper than the charge collection region of the photoelements in order to isolate adjacent columns of photoelements. There are various ways of implementing the channel stops. The channel stops may merely be formed of a deep p+ implant. In LOCOS processes, the channel stops can be comprised of a p+ layer implanted beneath a field oxide. The channel stops can also be insulator trenches which can be surrounded by a p doped shell.

Photocharges are not only generated in the photogate or photodiode, but are also generated in and underneath the channel stops. If the CCD process and pixel design are properly optimized, photocharges generated in the vicinity of the channel stops can be collected by adjacent photoelements. Photogates of the pixels are clocked to transfer charges up and down the columns, and the polysilicon electrodes of the photogates are needed to induce the potential wells only in the channel within the center of a column. Since there is no need for the polysilicon layers to cover the channel stop in FT area CCD sensors and TDI CCD sensors, a portion of the polysilicon over the channel stop can be removed to enhance the short wavelength response. When portions of the polysilicon clock conductors (i.e., buses) are removed, the pixel is said to be "reticulated". The holes in the polysilicon are called reticulation holes. In general, a larger reticulation hole improves the short wavelength response relative to a smaller reticulation hole. However, the larger reticulation hole leaves a smaller remaining pixel area for use as a photogate, and therefore, a smaller charge carrying capacity in the column.

SUMMARY OF THE INVENTION

The subject of this invention is a TDI array architecture that circumvents the compromises ordinarily made between the charge handling capacity of the pixel column and the short wavelength response of the pixels (i.e., driven by the area of the pinned photodiode exposed through the reticulation in the pixel). The invention further provides a method of bussing clock signals to the photosites that optimizes both the line rate (i.e., clock rate) in TDI arrays and the short wavelength response.

It is an object to the present invention to enhance the blue wavelength response of a TDI sensor while maintaining a high charge carrying capacity for the sensor. It is a further object of the present invention to provide metal strapping of the clock bus structure to ensure high speed operation.

These and other objects are achieved in a TDI sensor that includes a column of pixels ordered from an initial pixel to a final pixel where each pixel includes reticulated clock conductors arranged to define a reticulation area and a pixel charge handling capacity. The reticulation area of a pixel increases from the final pixel to the initial pixel, and the pixel charge handling capacity increases from the initial pixel to the final pixel. The sensor includes a first bus structure of polysilicon, where the bus structure includes register element sets and each register element set includes a plurality of clock conductors. Each register element set includes a corresponding pixel reticulation area, and the pixel reticulation area of a first register element set is unequal to a pixel reticulation area of another register element set.

The sensor also includes a second bus structure of metal disposed substantially diagonally to the first bus structure. The second bus structure includes clock bus sets, and each clock bus set includes bus conductors. A first bus conductor of a first clock bus set includes parallel segments, and each parallel segment is co-parallel to the first bus structure. A first clock conductor of each register element set extends in an elongate direction and defines a predetermined clock conductor length in a direction perpendicular to the elongate direction. The first clock conductor of each register element set includes a first bridge segment having a predetermined bridge segment length in the direction perpendicular to the elongate direction, the predetermined clock conductor length being greater than the predetermined bridge segment length. A first parallel segment of the first bus conductor of each clock bus set is disposed over the first bridge segment of the first clock conductor of a corresponding set of the plurality of register element sets and connected thereto with a contact.

BRIEF DESCRIPTION OF DRAWINGS

The invention will be described in detail in the following description of preferred embodiments with reference to the following figures wherein:

FIG. 9A is a schematic view of the known TDI concept;

FIG. 9B is a schematic plan view of a known TDI sensor showing projection of an image conjugate onto the sensor at time t1;

FIG. 9C is a schematic plan view of a known TDI sensor showing projection of an image conjugate onto the sensor at time t2.

DETAILED DESCRIPTION OF PREFERRED EMBODIMENTS

In vertical columns of TDI arrays of pixels, only the final stage of each column is required to have the full charge handing capacity. In a conventional uniformly reticulated TDI array, the reticulation hole size is the same in all stages (i.e., in all pixels in the vertical column), and the reticulation hole size is limited by the size of the gate electrodes necessary to achieve the desired charge handling capacity of the last TDI stage. However, in the present invention, the reticulation holes are made larger in earlier stages where the full charge handling capacity is never required; however the final stage has a reticulation hole size that permits large enough photogates to carry the full charge handling capacity of the column. Because earlier stages have larger reticulation hole sizes, the mean reticulation hole size averaged over a column is larger that the reticulation hole size of the final stage, and the array as a whole will have a better short wavelength response.

For example, if a TDI column has 96 stages (i.e., 96 pixels), the first stage only requires 1/96 of the charge handling capacity of the array, the second stage requires only 2/96, the third stage requires only 3/96, and so on. The last stage requires 96/96 (i.e., 100%) of the charge handling capacity of the array. In a conventional uniformly reticulated TDI array, the reticulation hole size is the same in all 96 stages (i.e., 96/96 or 100% of the charge handling capacity of the final stage). However, in this present invention, the reticulation holes can be made larger in earlier stages where the full charge handling capacity is never required since the charge handling capacity of each TDI stage defines the maximum permitted reticulation hole size. The short wavelength response of the entire TDI column is based on the reticulation hole size averaged over the pixels in the column. In the present invention, the variably reticulated pixels in the column afford an enhanced average reticulation hole size, and therefore, an enhanced short wavelength response.

Figure 1:
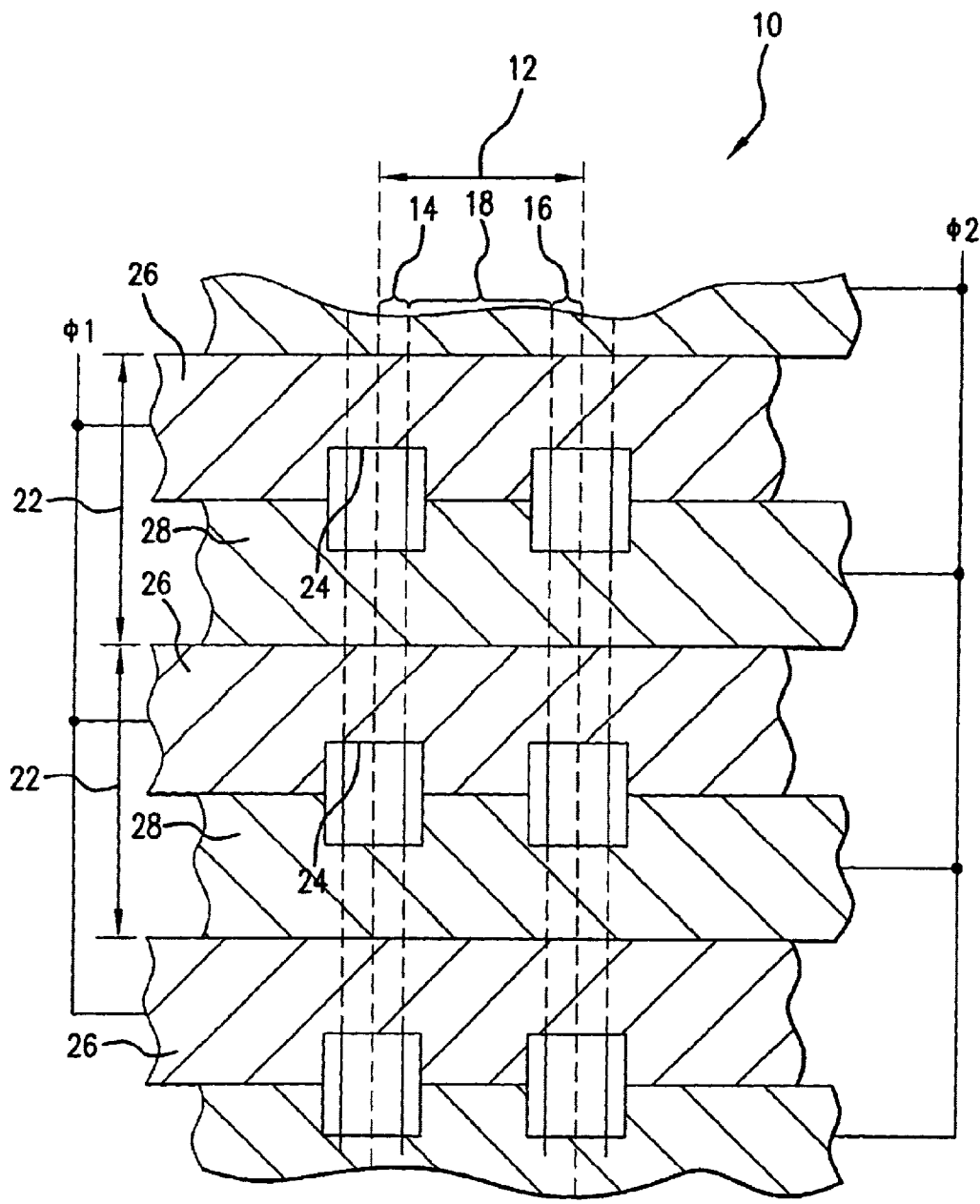
FIG. 1 is a plan view of a couple of two phase stages of a TDI column with reticulated pixels according to the present invention.

In FIG. 1, sensor 10 includes channel structure 12, where channel structure 12 includes first and second channel stops 14, 16 and channel 18 therebetween. Note that channel stops 14, 16 are half width where the remaining half widths are attributed to adjacent channel structures. Insulatively disposed over channel structure 12 is bus structure 20 that includes a plurality of register element sets 22 and each register element set includes corresponding pixel reticulation area 24. In the present invention, the pixel reticulation area of a first register element set is unequal to the pixel reticulation area of another register element set.

Each register element set 22 includes a plurality of clock conductors. In FIG. 1, a register element set includes first and second conductors 26, 28 coupled to respective first and second phase clock signals. Additional clock conductors are included in each register element set to achieve three and four phase clocking structures.

Figure 2:
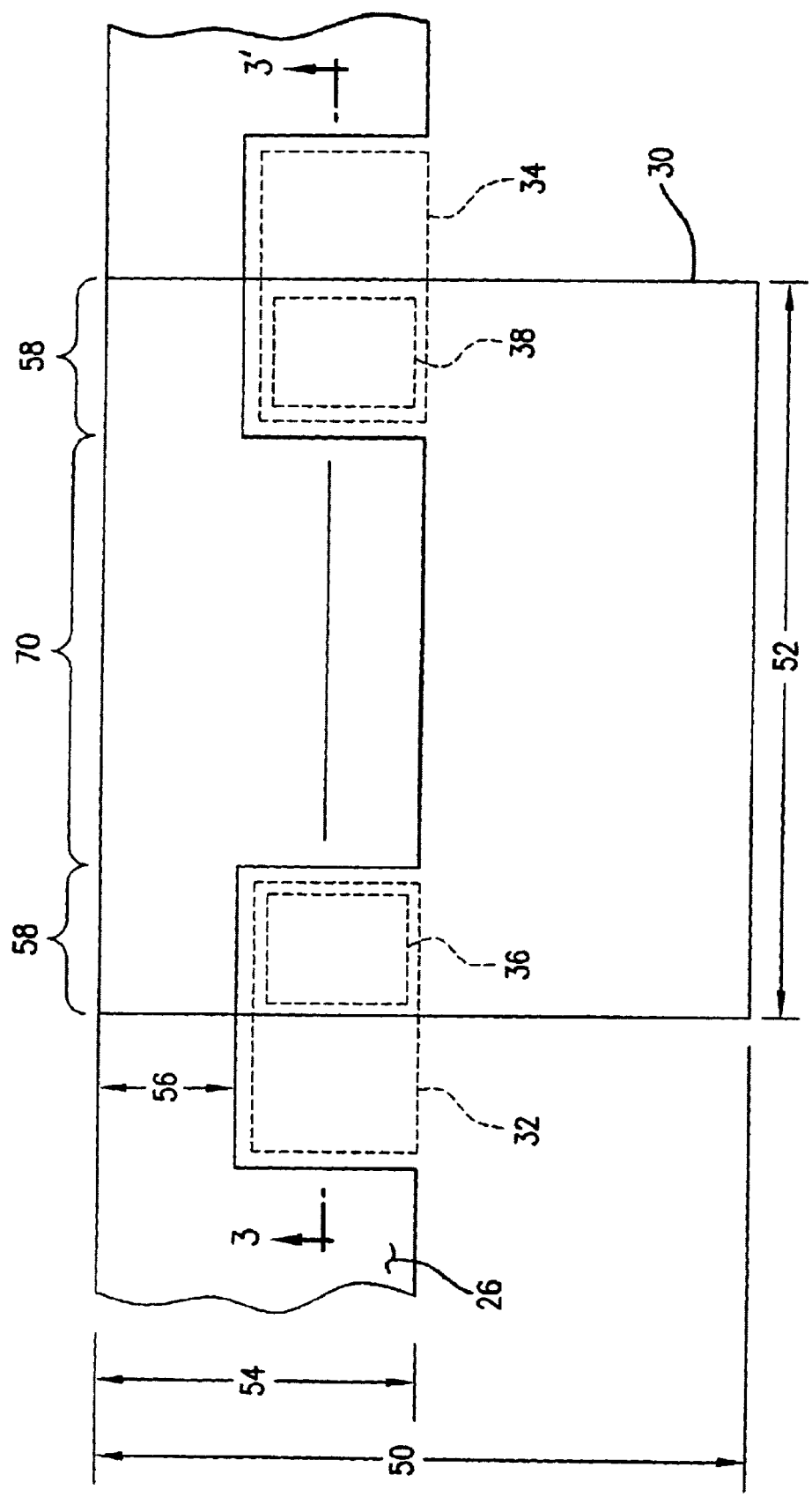
FIG. 2 is a plan view of a single pixel according to the present invention.

In FIG. 2, first clock conductor 26 includes first and second reticulation holes 32, 34 therein (shown as a phantom outline), each being characterized by respective first and second reticulation areas. A first reticulation area of first reticulation hole 32 in first clock conductor 26 of a first register element set is unequal to a first reticulation area of first reticulation hole 32 in first clock conductor 26 of another register element set (i.e., in a different pixel of the column of pixels). The second reticulation area of second reticulation hole 34 in first clock conductor 26 of the first register element set is unequal to a second reticulation area of second reticulation hole 34 in first clock conductor 26 of another register element set. First and second reticulation holes 32, 34 include within them respective first and second portions 36, 38 (also shown as a phantom outline). First and second portions 36 and 38 are areas within pixel area 30 defined by channel structure 12 and the register element set to which the first conductor belongs.

Figure 3:
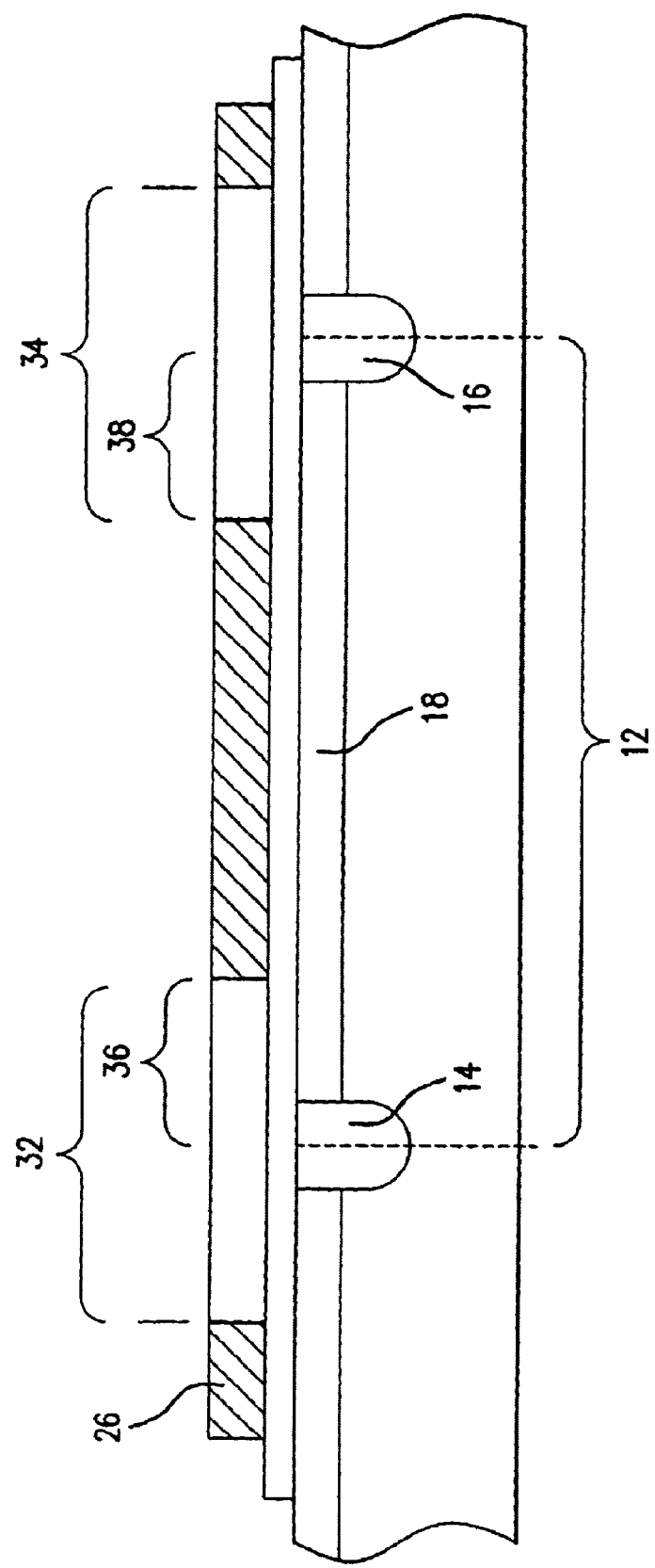
FIG. 3 is a section view of the pixel of FIG. 2.

FIG. 3 is a section view taken along section line 3–3' of FIG. 2. In FIG. 3, channel structure 12 includes first and second channel stops 14, 16 and channel 18 formed therebetween in a substrate. First clock conductor 26 is insulatively disposed over channel structure 12. First clock conductor 26 includes first and second reticulation holes 32, 34 therein, and first and second reticulation holes 32, 34 include within them respective first and second portions 36, 38.

Second conductor 28 (FIG. 1) is mirror symmetric with first conductor 26 (FIGS. 1 and 2) such that conductor 28 includes first and second reticulation holes 42, 44 mirror symmetric with first and second reticulation holes 32, 34 of conductor 26. First and second reticulation holes 42, 44 in turn include third and fourth portions 46, 48 mirror symmetric with first and second portions 36, 38 of first conductor 26. First and second portions 36, 38 together with third and fourth portions 46, 48 form the reticulation area of pixel 30. The reticulation area of pixel 30 has no overlayer of conductor (e.g., polysilicon) that can attenuate photons. This directly exposes the silicon below and allows the entire reticulation area to convert photons into photocharge as with a photodiode or a pinned photodiode.

In FIG. 2, pixel area 30 is characterized by pixel length 50 and pixel width 52, and first conductor 26 is characterized by conductor length 54. First conductor 26 is comprised of alternating photogate regions 70 and bridge regions 72 (see FIG. 5). In FIG. 2 and within pixel 30, bridge regions are characterized by bridge length 56 and bridge half width 58. In between bridge regions are photogate regions that are characterized by photogate length 54 and photogate width 70 that is equal to pixel width 52 less the total bridge width (e.g., twice width 58).

In preferred embodiments, pixel length 50 (also called the pitch) is fixed. In the present two phase example, conductor length 54 is also fixed at half of pixel length 50 (due to the two phase clocking). Bridge length 56 is usually fixed at the minimum linewidth permitted for a polysilicon line. The conductor reticulation length is equal to conductor length 54 minus bridge length 56. Bridge width 58 is varied to vary reticulation area by TDI stage since bridge length 56 is fixed at the minimum permitted for the selected process. Of course, increasing the bridge width results in decreasing the photogate width (and therefore the photogate's charge handling capacity) since pixel width 52 is fixed.

Figure 4:
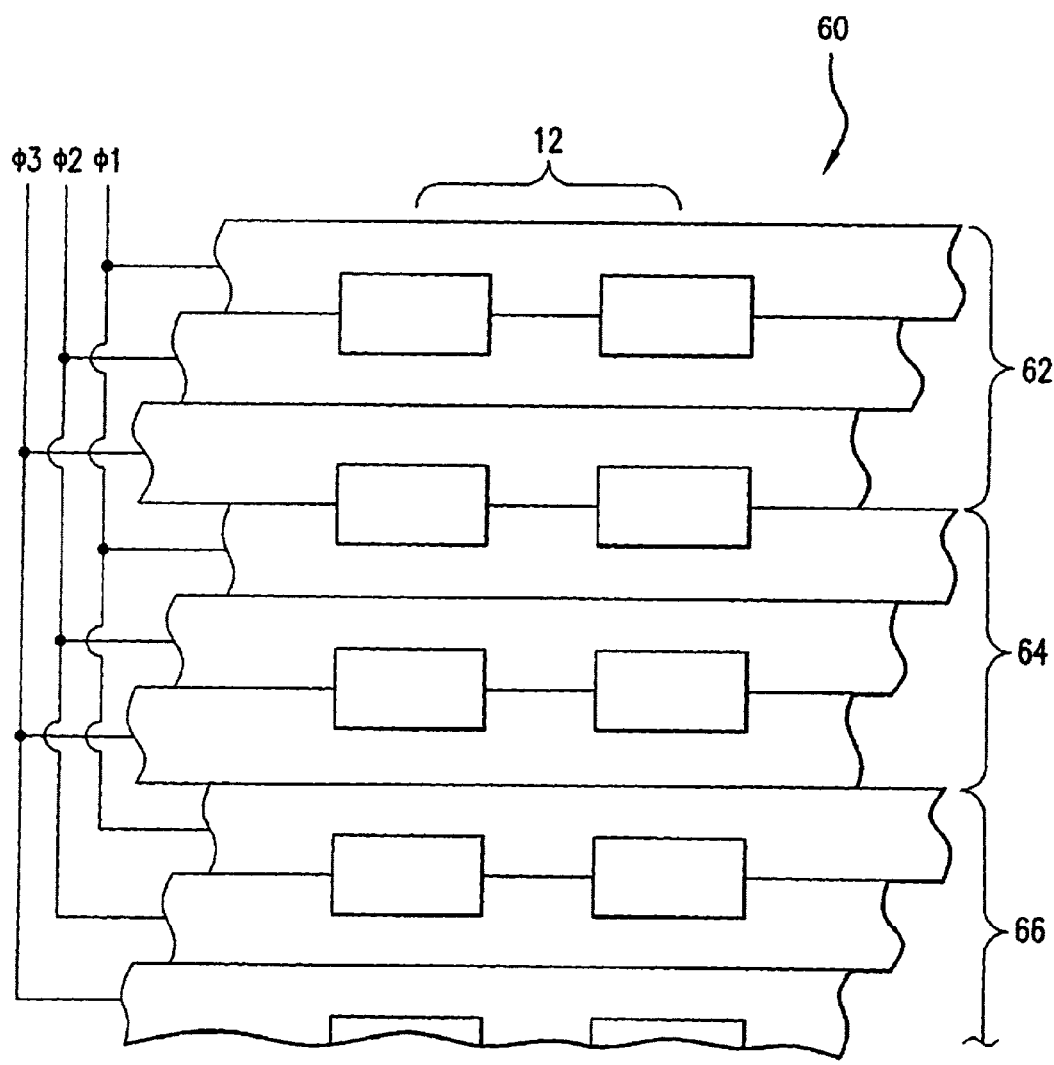
FIG. 4 is a plan view of a couple of three phase stages of a TDI column with reticulated pixels according to the present invention.

In FIG. 4, three phase variably reticulated sensor section 60 includes first reticulated register element set 62, second reticulated register element set 64 and a portion of third reticulated register element set 66 all disposed over channel structure 12. As can be seen, first register element set 62 is mirror symmetric with second register element set 64. As with two phase structures, the first and second phase clock electrodes of first register element set 62 are mirror symmetric. Since sensor section 60 is based on an odd number of clock phases, the third phase clock electrode of first register element set 62 is paired with the first phase clock electrode of second register element set 64 in a mirror symmetric arrangement, and it is the second and third phase clock electrodes of second register element set 64 that are mirror symmetric. When the bus structure is based on an odd number of clock phases, pairs of register element sets are repeated down the column structure, but each register element set of the pair is mirror symmetric with the other register element set of the pair.

The reticulation holes do not have to be entirely over the channel stops. A portion of each photogate electrode over the underlying channel can be replaced by pinned photodiodes. First, second, third and fourth portions 36, 38, 46, 48 may be located over channel stops 14, 16 only (FIG. 1), or these portions may extend to open a portion of the area over channel 18 so that the exposed area below these reticulation portions is a pinned photodiode.

Alternatively, some of the photogates can be replaced by pinned photodiodes. When an entire photogate is replaced by a pinned photodiode, the photodiode is to be pinned to a potential mid way between the potential induceable by adjacent photogates when driven by suitable clock signals so that charge transfer function may be maintained.

There are certain trade-offs in reticulating the photosites. The charge handling capacity of the pixel is a function of the pixel geometry. In general, the larger the area of the photogate, the larger is the charge handling capacity of the pixel, though the functional dependence between these two variables is not necessarily linear. If the pixel pitch is fixed, the reticulation hole size will limit the photogate area, and thus, limit the charge handling capacity of the pixel. The required charge handling capacity of the final pixel in a column is usually set by the application. This charge handling capacity limits the area available for reticulation and limits the amount of short wavelength response enhancement that can be achieved through reticulation for any given fixed pixel pitch.

A unidirectional TDI array (an array where photocharges can only follow the image in one direction) is optimally reticulated when the reticulation holes are largest at the first stage and smallest at the final stage. The short wavelength response enhancement that can be achieved may be better appreciated in a more concrete example.

Figure 5:
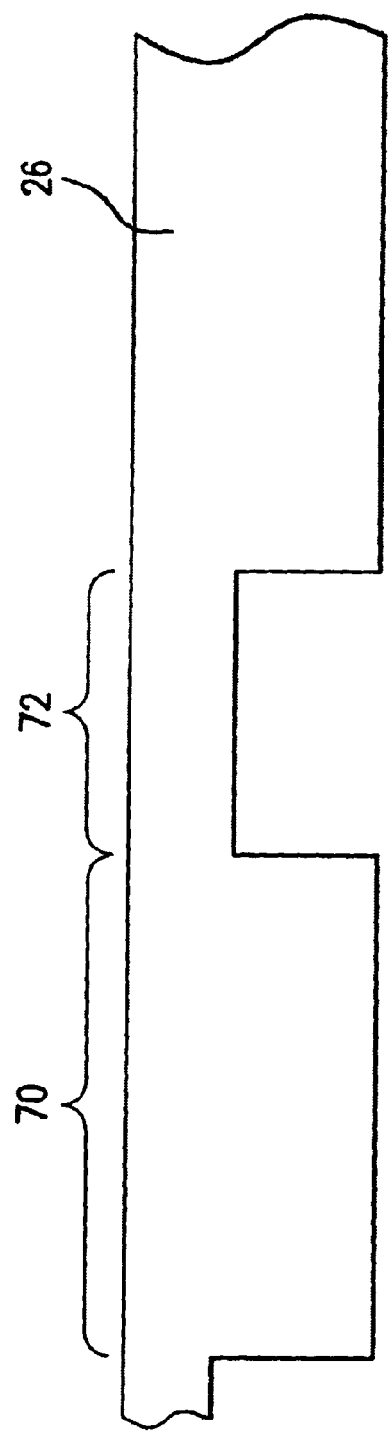
FIG. 5 is a plan view of a reticulated polysilicon clock conductor of the present invention.

A polysilicon clock conductor (e.g., conductor 26, FIG. 2) includes full length (e.g., length 54, in the column transfer direction) but limited width 70 photogate areas (e.g., polysilicon gate 70 in FIG. 5) connected together by interconnecting partial length (e.g., length 56, in the column transfer direction) polysilicon bridge areas (e.g., bridge area 72 in FIG. 5). The reticulation hole width is the bridge width, and it varies between TDI stages. The reticulation hole length (in the column transfer direction) is the difference between the full pixel length of photogate areas 70 and the partial length of bridge areas 72. The clock conductor includes alternating full length and partial length segments of polysilicon conductor.

Denote pixel area 30 (FIG. 2) by $A_{PIXEL}$, the photogate area by $A_{GATE}$, the reticulation hole area by $A_{RET}$, and the polysilicon bridge area by $A_{BRIDGE}$ (the polysilicon bridge length is usually limited by CCD process rules). The only independent variable is the reticulation hole width $W_{RET}$. $A_{GATE}$, $A_{RET}$, and $A_{BRIDGE}$ are all functions of $W_{RET}$. To illustrate how $W_{RET}$ should be varied, consider an example where the TDI column pitch is a 13 μm pitch length and there are 96-stages of 3-phase TDI photogates each in a column of the array.

$L_{PIXEL}$=13 μm (set by pixel pitch)

$W_{PIXEL}$=13 μm (set by pixel pitch to make a square pixel)

$A_{PIXEL}$=$W_{PIXEL}$ *$L_{PIXEL}$=169 μm$^2$ $L_{PIXEL\ 1\ C11}$=4.5 μm (phase 1)

$L_{PIXEL\ 1\ C12}$=4.25 μm (phase 2)

$L_{PIXEL\ 1\ C13}$=4.25 μm (phase 3)

$L_{BRIDGE\ 1\ C11}$=2.5 μm (fixed by process design rules)

$L_{BRIDGE\ 1\ C12}$=2.5 μm–0.5 μm overlap with adjacent gates=2.0 μm $L_{BRIDGE\ 1\ C13}$=2.5 μm $L_{RET}$=$L_{PIXEL}$−$L_{BRIDGE\ 1\ C11}$−$L_{BRIDGE\ 1\ C12}$−$L_{BRIDGE\ 1\ C13}$=6 μm $W_{RET}=3$ μm at the last stage, larger in earlier stages $W_{BRIDGE}=W_{RET}$ $A_{RET}=W_{RET} * L_{RET}=6W_{RET}$ μm$^2$ $A_{BRIDGE}=W_{BRIDGE} * (L_{BRIDGE\ 1\ C11}+L_{BRIDGE\ 1\ C12}+L_{BRIDGE\ 1\ C13})=7W_{RET}$ μm$^2$ $A_{GATE}=A_{PIXEL}-A_{RET}-A_{BRIDGE}=(169-13W_{RET})$ μm$^2$ On the last (96th) stage, $W_{RET}=3$ μm, so $A_{GATE}=130$ μm$^2\approx0.769 * A_{PIXEL}$ and $A_{RET}=18$ μm$^2\approx0.107 * A_{PIXEL}$. Note that only 10.7% of the pixel area is sensitive to ultra-violet wavelengths. With variable reticulation technology as disclosed herein, on the 24th stage, the photogate area can be made as small as $A_{GATE}=130*(24/96)$ μm$^2$=32.5 μm$^2\approx0.192 * A_{PIXEL}$ and still achieve the required charge handling capacity. $W_{RET}$ is 10.5 μm, while $A_{RET}$ is 63 μm$^2\approx0.372 * A_{PIXEL}$. On the 24th stage, 37.2% of the pixel area—more than twice the 10.7% in the 96th stage—is sensitive to ultra-violet. The maximum attainable enhancement in short wavelength response can be calculated from the average $A_{RET}$, which in turn is equal to the (96/2=48)th stage $A_{RET}$. On the 48th stage, $A_{GATE}=130*(48/96)$ μm$^2$=65 μm$^2\approx0.384 * A_{PIXEL}$. $W_{RET}$ is then equal to 8 μm, while the 48th stage $A_{RET}$ is equal to 48 μm$^2\approx0.284 * A_{PIXEL}$. Compared to a uniformly reticulated TDI array with the same charge handling capacity, the variably reticulated TDI array can have up to [(0.284-0.107)/0.107=165%] better short wavelength response. If reticulation is varied properly, the full charge handling capacity is a function only of the 96th stage $A_{GATE}$ and will not be affected by the variation in reticulation hole sizes.

A bi-directional TDI array (an array where photocharges can follow the image in either directions) is optimally reticulated when the reticulation holes are largest at the middle stage and smallest at the first and final stages. The first stage has the same reticulation as the final stage since the first stage can act as the final stage if the direction of motion is reversed. The short wavelength response enhancement will not be as large as in uni-directional TDI arrays. However, the short wavelength response can still be significantly better than uniformly reticulated TDI arrays.

Polysilicon films have greater resistance per square than, for example, metal films such as aluminum. When the films are patterned and etched to form wires, the polysilicon wires exhibit greater electrical resistance than the metal wires. In order to enhance the transfer speed of charges down the channel structure, the polysilicon bus structure may be "strapped" with metal straps (e.g., aluminum straps). Polysilicon clock conductors (e.g., clock conductor 26) typically span many adjacent channel structures and can exhibit significant end to end resistance. In a representative TDI sensor, there may be 512 channel structures in parallel, each channel structure having 96 TDI stages (i.e., 96 register element sets). A polysilicon clock conductor that spans 512 channel structures will experience a significant end to end resistance and distributed capacitance load. Given the high resistance of polysilicon conductors (at least relative to metal conductors) and the distributed capacitance, a clock signal propagating in the polysilicon clock conductor will exhibit a significantly long rise time due to RC delay (i.e., resistance-capacitance delay), particularly when the reticulations are large and the polysilicon bridges are small. For this reason, metal straps are used to connect a clock signal to the corresponding polysilicon clock conductors at several points along each polysilicon conductor.

In uniformly reticulated TDI arrays, the time constants of the polysilicon clock conductors are reduced by connecting an additional layer of diagonal low-resistance metal bus conductors or straps to the polysilicon clock conductors. By doing so, the voltage swings of the photogated clock signals become more uniform across the width of the array. Although the diagonal metal bus conductors are opaque and block light from the stages that they run across, the same amount of light is blocked from each TDI column. Each TDI column exhibits the same responsivity to illumination. As long as the density of the diagonal buses is not too high, there is only a minimal reduction in the photoresponse.

Diagonal metal bus conductors that carry clock signals are insulatively disposed over the polysilicon bus structure in TDI sensors and periodically connected to the underlying polysilicon bus structure at contacts. Because a metal bus conductor is disposed diagonally to the polysilicon bus conductors, the metal bus conductor will cross each polysilicon bus conductor of the same phase. A properly disposed contact between metal and polysilicon is used to make an electrical connection between the metal bus conductor and a desired polysilicon clock conductor.

Diagonal metal straps block photons from the photosites, but the metal straps are designed so that the TDI sensors can tolerate the resulting blockage. Since photocharge is integrated along the length of the channel structure, the number of TDI stages can be increased to compensate for any loss of illumination from photons blocked by the metal straps. It is however required that the metal straps spanning one channel structure block no more and less photons than the metal strap spanning any other channel structure. That is to say, the area of the metal strap over one channel structure should be the same as the area of the metal strap over each other channel structure. In this way, each channel structure will have the same responsivity to illumination as the other channel structures.

However, this requirement becomes more complicated when diagonal metal straps are used to strap a variably reticulated polysilicon bus structure. First, the area of the metal strap obscuring photogates over one channel structure should be the same as the area of the metal strap obscuring photogates over each other channel structure. Second, the fraction of a reticulation hole obscured by the metal strap over one channel structure should be the same fraction of a reticulation hole obscured by the metal strap over each other channel structure. A metal strap that blocks photons in the early stages of the TDI column is more likely to lessen the short wavelength response (e.g., blue response) of the column than a metal strap that blocks photons in the last stage of the TDI column since early pixels are more reticulated and relatively more sensitive to short wavelengths than pixels in the last stage. A single diagonal strap could cause one TDI column favor long wavelengths and cause another TDI column to favor short wavelengths.

Figure 6:
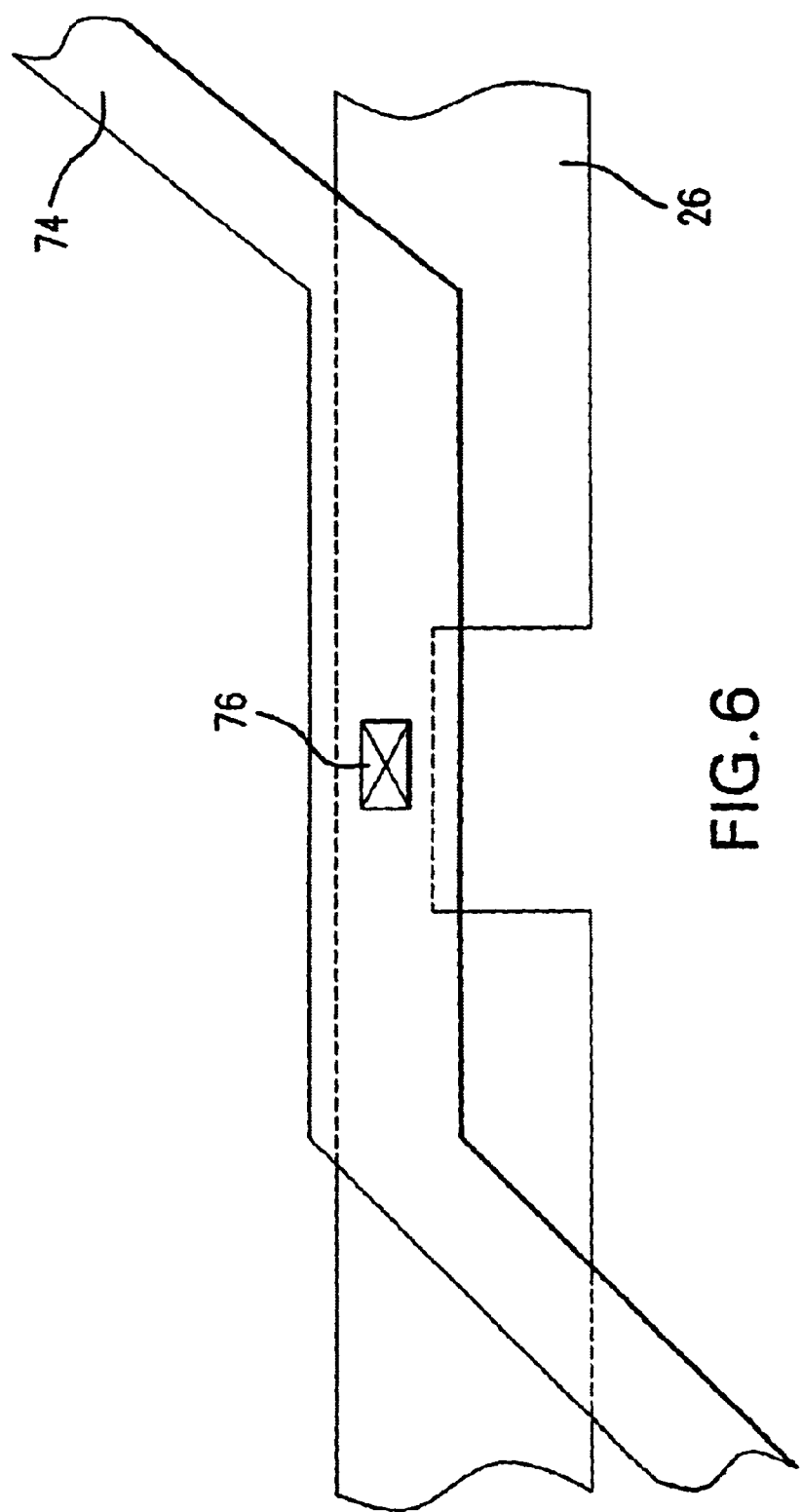
FIG. 6 is a plan view of a metal strapping conductor overlaying a reticulated polysilicon clock conductor of the present invention.

The manner in which variably reticulated TDI arrays are metal strapped should be examined more closely. In FIG. 5, reticulated polysilicon clock conductor 26 is formed of alternating photogate regions 70 and bridge regions 72. In FIG. 6, a metal bus conductor is shown that both (1) equally obscures the reticulation area of all pixels of a TDI column that the bus conductor crosses, and (2) equally obscures the photogate area of all pixels in the TDI column that the bus conductor crosses. In this way, the color response of all TDI columns in a TDI sensor will be the same.

Diagonal metal bus conductor 74 is insulatively disposed over underlying polysilicon clock conductor 26. However, diagonal metal bus conductor 74 is not diagonal everywhere, but instead parallels and overlays polysilicon clock conductor 26 in a region near polysilicon bridge region 72. Contact 76 connects metal bus 74 to polysilicon clock conductor 26 at bridge region 72. It should be understood that bridge region 72 and the corresponding reticulation hole in clock conductor 26 are centered over a channel stop such as channel stop 14 or 16. However, it should be equally understood that a width of bridge region 72 and the corresponding reticulation hole in clock conductor 26 varies between TDI stages and typically becomes wide enough to extend beyond the underlying channel stops to expose an underlying pinned photodiode, particularly in the earlier stages of a TDI column. The reticulation areas are varied by varying the width of the reticulation. The length of the polysilicon bridge is preferably the minimum permitted by the process design rules (to provide a maximum reticulation hole size). The design rules for the overlaying region of metal bus conductor 74 near polysilicon bridge 72 to which contact 76 is made, may result in metal bus conductor 74 overlying a fraction of the reticulation hole, where r is the fraction of reticulation hole that is obscured by the metal bus conductor. Fraction r is the same for all stages of the TDI column since the reticulation hole size is varied by varying its width and not varying its length. The diagonal portion of metal bus conductor 74 obscures an equal portion of the photogate region in all TDI columns. In fact, this arrangement may lead to a diagonal metal bus conductor that is a "stairstep" arrangement rather than a true diagonal.

Consider an example where there are m diagonal metal buses crossing each TDI column, and each TDI column has n TDI stages. If diagonal metal buses are arranged to traverse across a pixel so as to obscure 100*r percent of the reticulation hole, then diagonally metal strapped TDI array will still have 100*(n−r*m)/n percent of the response to illumination of a non metal strapped array. For example, if m=2, n=96, and r=0.5, metal strapping the TDI array will result only in a 1% reduction in short wavelength response, but will allow the array to be clocked to follow the image at a much higher speed.

TDI arrays with variable reticulation have to be metal strapped differently than uniformly reticulated arrays. When the TDI array is uniformly reticulated, it does not matter whether the metal bus crosses the first or the last TDI stage, since each stage has the same response to both intensity and color. On variably reticulated TDI arrays, stages with larger reticulation holes have higher short wavelength response. To prevent any column to column response non-uniformity, the number of reticulation hole sizes should be equal to m, the number of diagonal metal buses crossing each column. There is however an optimum number of metal buses crossing each column. If m is too large, blue response will be poor, since more pixels per column will have part of its reticulation hole obscured. If m is too small, the number of reticulation hole sizes will also be small, so that reticulation hole size will sub-optimum for a large number of stages, and the blue response will be poorer than would otherwise be expected. The optimum m can be calculated from equation 1.

$$m_{optimum} = \sqrt{\frac{n}{r*\left(\frac{2*L_{PIXEL}^2}{A_{GATE\ 1\ LAST}} - k\right)}} \qquad \text{Equation 1}$$

where n is the number of TDI stages, r is the fraction of the reticulation hole that is obscured by metal bus, $A_{GATE\ 1\ LAST}$ is the photogate area of the last TDI stage, and k is a constant that is 1 for a uni-directional TDI array and 3/2 for a bi-directional TDI array. Using values from the earlier example, (n=96, r=0.5, $L_{PIXEL}$=13 μm, and $A_{GATE\ 1\ LAST}$= 130 μm$^2$), $m_{OPTIMUM}$ turns out to be 10.95 for a uni-directional array and 13.21 for a bi-directionally array. For both cases, m=12 is a good choice and is close to optimum. The integer 12 is an integer (1) close to $m_{OPTIMUM}$ and (2) divides evenly into n.

With m=12, in a unidirectional array, the average $A_{RET}$ equals 42.66 μm$^2$=0.252 * $A_{PIXEL}$. Even with the diagonal metal straps obscuring some of the reticulated area, an average of 25.2% of the pixel area is reticulated and has enhanced sensitivity to ultraviolet light. This is more than twice the 10.7% in the uniformly reticulated array. For a bi-directional array, the average $A_{RET}$ equals 28.59 μm$^2$= 0.169 * $A_{PIXEL}$. An average of 16.9% of the pixel area is reticulated and has enhanced sensitivity to ultraviolet light. This too is better than the 10.9% in uniformly reticulated array but is not as good as the 25.2% in variably reticulated unidirectional arrays.

A preferred embodiment of this invention includes a variably reticulated TDI imaging region and one or two horizontal CCD readout shift registers. At least two horizontal CCD readout registers are needed when the TDI array is to be operated as a bi-directional TDI sensor. One horizontal CCD readout register is sufficient when the TDI array is to be operated as a unidirectional TDI sensor.

Charges accumulated in the last stage of each channel structure are transferrable to a corresponding register element in an output horizontal readout register. In order to achieve high transfer speed, multi-tapped readout registers are preferably used. For example, the 512 element readout register of this example may have 8 taps so that each tap reads out is own 64 elements of the readout register. Each tap includes an output sensing node with associated reset structure and an output buffer amplifier.

One or more isolation TDI rows to separate the imaging region from the horizontal readout register are preferably associated with each readout register. The isolation rows, as well as the last few rows in the imaging region, may or may not be reticulated since full or near full charge handling capacity is needed. The isolation rows also do not have to be orthogonal. Charge transfer along the isolation rows may be done at a slanted angle to free up more semiconductor area for the horizontal CCD readout register.

Figure 7:
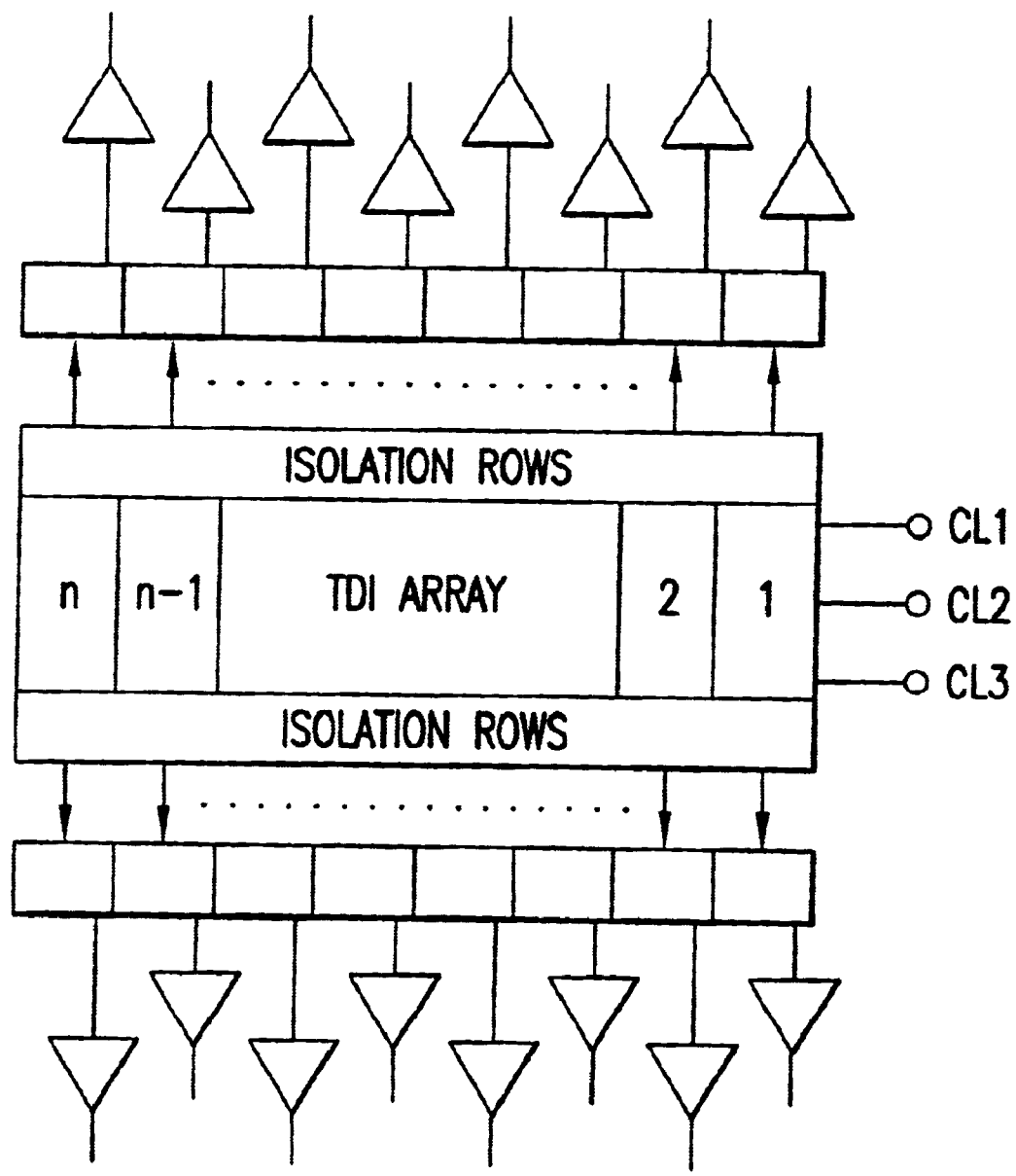
FIG. 7 is a function block diagram of a preferred embodiment of a TDI sensor of the present invention.

In FIG. 7, an exemplary bi-directional embodiment of the invention includes the TDI array with two readout registers and 8 output taps from each output register. Because the device is variably reticulated, the device will have superior short wavelength response when compared to a uniformly reticulated device with the same charge handling capacity.

The photosites in the variably reticulated imaging region can be comprised of photogates, pinned photodiodes, or a combination of the two.

The imaging region is preferably metal strapped in the manner described above to enhance the TDI line transfer rate while still optimizing the short wavelength response.

Figure 8:
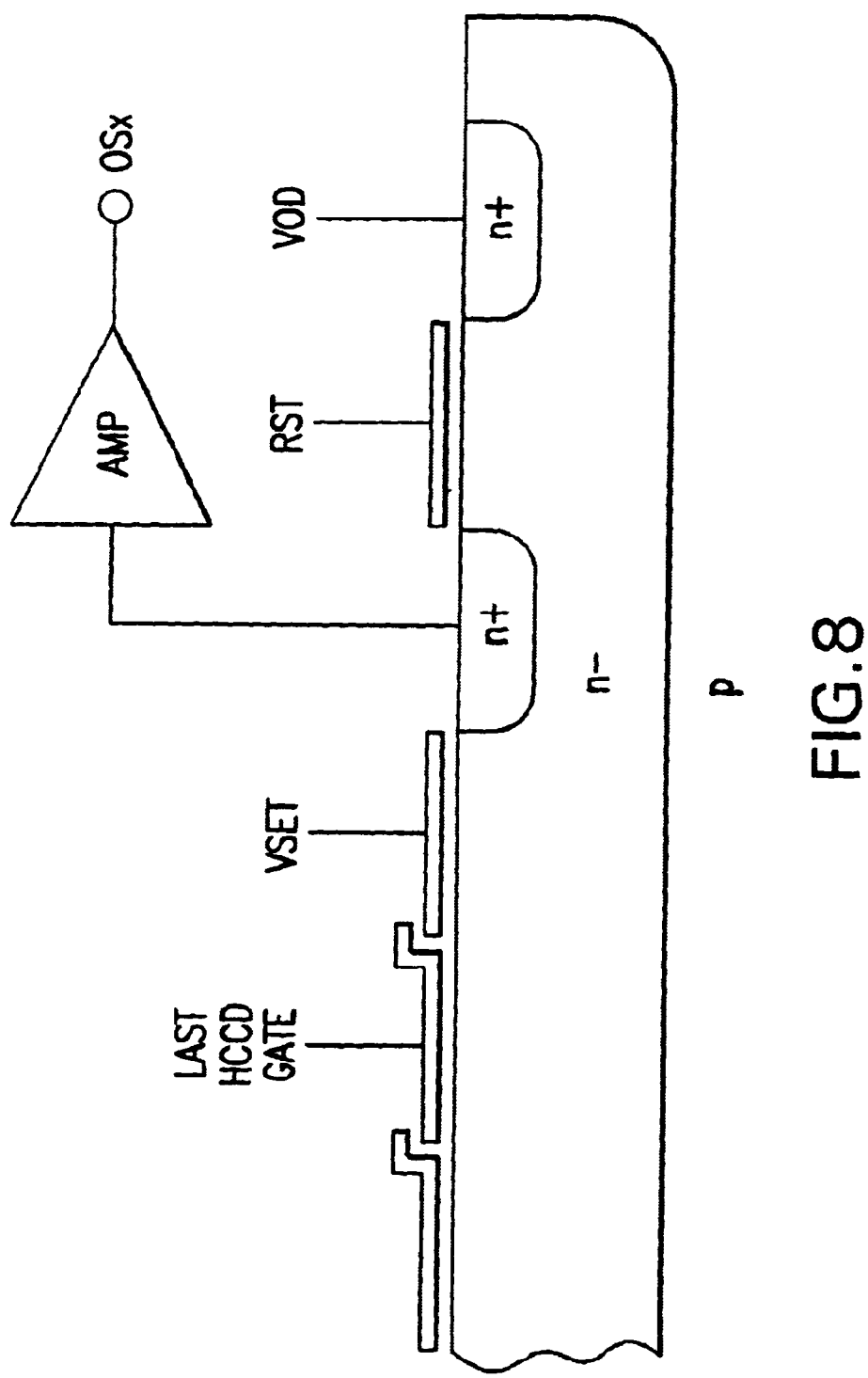
FIG. 8 is a section view of an output tap of the present invention.
Figure 10:
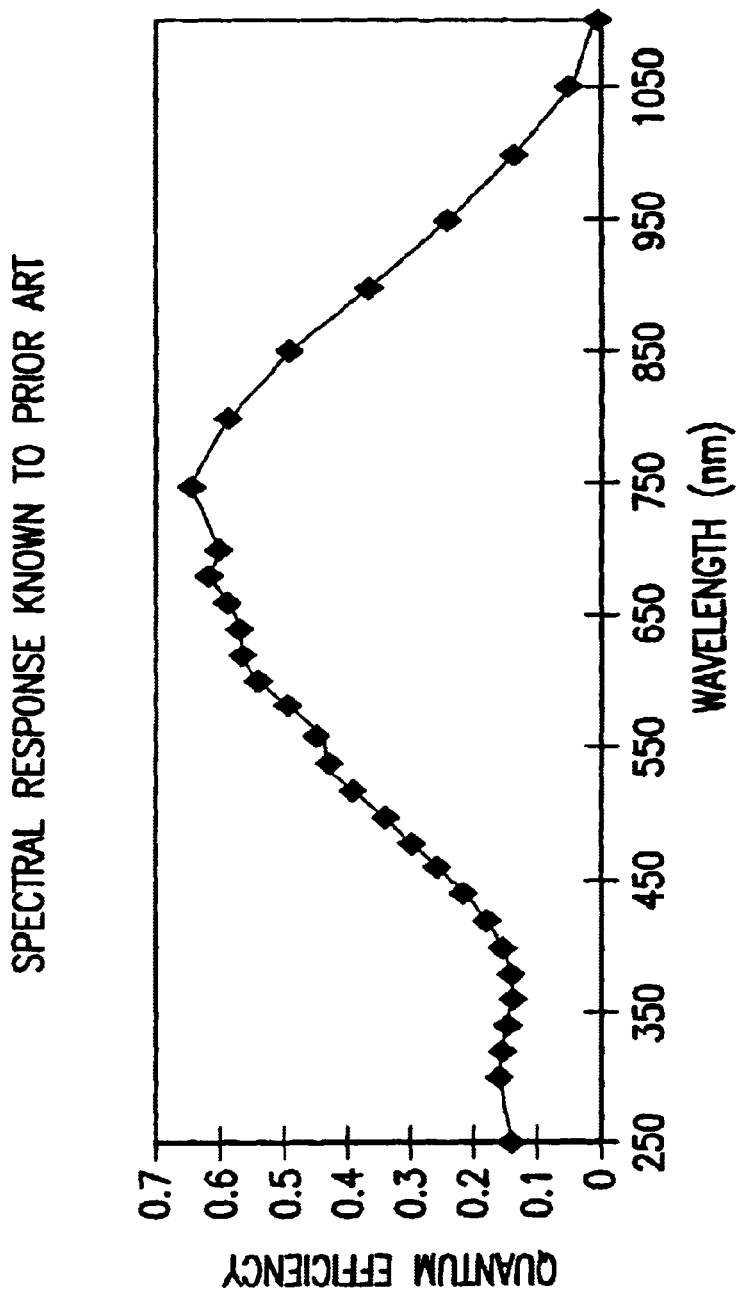
FIG. 10 is graph showing the known spectral quantum efficiency of silicon for converting photons to charge.

The horizontal CCD readout register segments are connected to output structures. Photo-optically generated charge packets are shifted out of the last cell in each readout register segment onto the output structure, which includes of a set or bias gate, a sense node (either a floating node diffusion or a floating gate), a reset structure, and an output amplifier (see FIG. 8). Charges are read by measuring the change in voltage across the capacitance of the sense node. Since the amount of charge being detected is typically small, it is important that the capacitance of the sense node be minimized so that the sensitivity of the output parameter being measured, be it voltage or current, to the signal charge is maximized. The set gate acts as an interface to selectively isolate and couple charges between the last readout segment cell and the floating node diffusion. The set gate is usually not present on output structures with floating gates. Like the photoelement reset structure, the output reset structure can either be lateral or vertical, though lateral output reset structures are more common. FIG. 8 illustrates the cross-sectional view of one of the possible output structure configurations. The last readout segment cell is connected to a set gate, which in the figure is supplied with signal VSET. The set gate is in turn connected to a floating node diffusion. The floating node diffusion is connected to both the lateral reset structure and the output amplifier, the later shown schematically. The reset gate is supplied with the signal RST, while the reset drain is supplied with the signal VOD.

A particular embodiment of the output amplifier may be a two and a half stage source follower. When any of the amplifier outputs, labeled OSx in FIG. 7, are connected either to constant current sources or resistive loads, a voltage OSx output is obtained. The amplifier does not have to be of this particular type. In particular, the amplifier could produce a current output instead of a voltage output and include any of the following: feedback circuitry, gain enhancement and adjustment circuitry, bandwidth adjustment circuitry, sample-and-hold circuitry, circuitry to damp out oscillations, feedthrough cancellation circuitry, and signal-to-noise optimization circuitry.

Some advanced TDI sensors have a mechanism to electronically vary the responsivity to illumination of a TDI column. For example, a mechanism may select the number of stages that are to be integrated in each TDI column. In the present example, there are 96 stages. The mechanism to achieve electronically controlled responsivity may control the sensor to integrate either 96 stages or 48 stages (i.e., half of the 96 stages). Other stage selection divisions may also be employed (e.g., 96 stages, 72 stages, 48 stages and 24 stages).

One such stage selection mechanism is described in U.S. patent application Ser. No. 09/006,888, incorporated herein by reference. In a TDI sensor with buried vertical channels, this mechanism achieves stage selection by altering the bus structure design so that one clock conductor is electrically isolated from all other conductors in the bus structure, for example, a phase 2 clock conductor of the 48th register element set is isolated. The isolated clock conductor is operated in one of two modes: a normal phase 2 clock signal mode to select 96 stages for integration (i.e., effectively reconnecting the isolated conductor into the bus structure), and a barrier mode (by applying a negative bias to the isolated clock conductor) to select 48 stages for integration. The negative bias operates the vertical channel that is disposed under the isolated clock conductor as a vertical antiblooming structure to discharge unselected signal charges (before the isolated conductor) into the substrate while integrating selected signal charges (after the isolated conductor).

In FIG. 7, some clock conductors for the imaging region clocks, CLx, can be isolated from the bus structure. With this feature, the user of the array can control the separately connected clock conductor to select the number of TDI stages to be integrated and shunt other stages away. Stage selectability can be combined with bi-directionality to produce four TDI sensor variations:

| | |
|---|---|
| Uni-directional | Not stage-selectable |
| Bi-directional | Not stage-selectable |
| Uni-directional | Stage-selectable |
| Bi-directional | Stage-selectable |

Although this disclosure focuses on CCD image sensors, those skilled in the art will recognize the applicability of this invention to other TDI devices such as those based on such semiconductor technology process platforms as CMOS, NMOS, bipolar, bi-CMOS, silicon germanium, amorphous silicon, GaAs and other compound semiconductors.

Having described preferred embodiments of a novel variably reticulated time delay and integrate sensor (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by letters patent is set forth in the appended claims.

What is claimed is:

1. A sensor comprising a bus structure, wherein:
   the bus structure includes a plurality of register element sets;
   each register element set includes a corresponding pixel reticulation area;
   a pixel reticulation area of a first register element set is unequal to a pixel reticulation area of another register element set.

2. The sensor of claim 1, wherein:
   each register element set includes a plurality of clock conductors;
   a first clock conductor of each register element set includes a first reticulation hole therein characterized by a respective first reticulation area;
   a first reticulation area of the first reticulation hole in the first clock conductor of the first register element set is unequal to a first reticulation area of the first reticulation hole in the first clock conductor of another register element set.

3. The sensor of claim 2, further comprising a channel structure having first and second channel stops and a channel therebetween.

4. The sensor of claim 3, wherein:
   the bus structure is disposed over the channel structure to define a plurality of pixel areas, each pixel area corresponds to a respective register element set and is defined by an area of the respective register element set that is disposed over the channel structure;
   the first clock conductor of each register element set further includes a second reticulation hole therein;
   for each register element set, the first reticulation hole of the first clock conductor includes a respective first portion;
   for each register element set, the second reticulation hole of the first clock conductor includes a respective second portion; and
   for each register element set, the respective first and second portions are located within a corresponding pixel area.

5. The sensor of claim 4, wherein in the first register element set:
the first portion is located over the first channel stop; and
the second portion is located over the second channel stop.

6. The sensor of claim 4, wherein in the first register element set:
the first portion is located over the first channel stop and a first part of the channel; and
the second portion is located over the second channel stop and a second part of the channel.

7. The sensor of claim 4, wherein:
a second clock conductor of each register element set includes first and second reticulation holes therein;
for each register element set, the first reticulation hole of the second clock conductor includes a respective third portion;
for each register element set, the second reticulation hole of the second clock conductor includes a respective fourth portion;
for each register element set, the respective third and fourth portions are located within a corresponding pixel area;
the first, second, third and fourth portions in each pixel area define the respective pixel reticulation area.

8. The sensor of claim 7, wherein in the first register element set:
the first portion is located over the first channel stop;
the second portion is located over the second channel stop;
the third portion is located over the first channel stop; and
the fourth portion is located over the second channel stop.

9. The sensor of claim 7, wherein in the first register element set:
the first portion is located over the first channel stop and a first part of the channel;
the second portion is located over the second channel stop and a second part of the channel;
the third portion is located over the first channel stop and a third part of the channel; and
the fourth portion is located over the second channel stop and a fourth part of the channel.

10. The sensor of claim 4, wherein:
a second clock conductor of each register element set includes first and second reticulation holes therein;
a third clock conductor of each register element set includes first and second reticulation holes therein;
for each register element set, the first reticulation hole of the second clock conductor includes a respective third portion;
for each register element set, the second reticulation hole of the second clock conductor includes a respective fourth portion;
for each register element set, the first reticulation hole of the third clock conductor includes a respective fifth portion;
for each register element set, the second reticulation hole of the third clock conductor includes a respective sixth portion;
for each register element set, the respective third and fourth portions are located within a corresponding pixel area;
for each register element set, the respective fifth and sixth portions are located within a corresponding pixel area;
the first, second, third, fourth, fifth and sixth portions in each pixel area define the respective pixel reticulation area.

11. The sensor of claim 10, wherein in the first register element set:
the first portion is located over the first channel stop;
the second portion is located over the second channel stop;
the third portion is located over the first channel stop;
the fourth portion is located over the second channel stop;
the fifth portion is located over the first channel stop; and
the sixth portion is located over the second channel stop.

12. The sensor of claim 10, wherein in the first register element set:
the first portion is located over the first channel stop and a first part of the channel;
the second portion is located over the second channel stop and a second part of the channel;
the third portion is located over the first channel stop and a third part of the channel;
the fourth portion is located over the second channel stop and a fourth part of the channel;
the fifth portion is located over the first channel stop and a fifth part of the channel; and
the sixth portion is located over the second channel stop and a sixth part of the channel.

13. The sensor of claim 4, wherein:
a second clock conductor of each register element set includes first and second reticulation holes therein;
a third clock conductor of each register element set includes first and second reticulation holes therein;
a fourth clock conductor of each register element set includes first and second reticulation holes therein;
for each register element set, the first reticulation hole of the second clock conductor includes a respective third portion;
for each register element set, the second reticulation hole of the second clock conductor includes a respective fourth portion;
for each register element set, the first reticulation hole of the third clock conductor includes a respective fifth portion;
for each register element set, the second reticulation hole of the third clock conductor includes a respective sixth portion;
for each register element set, the first reticulation hole of the fourth clock conductor includes a respective seventh portion;
for each register element set, the second reticulation hole of the fourth clock conductor includes a respective eighth portion;
for each register element set, the respective third and fourth portions are located within a corresponding pixel area;
for each register element set, the respective fifth and sixth portions are located within a corresponding pixel area;
for each register element set, the respective seventh and eighth portions are located within a corresponding pixel area;
the first, second, third, fourth, fifth, sixth, seventh and eighth portions in each pixel area define the respective pixel reticulation area.

14. The sensor of claim 13, wherein in the first register element set:

the first portion is located over the first channel stop;
the second portion is located over the second channel stop;
the third portion is located over the first channel stop;
the fourth portion is located over the second channel stop;
the fifth portion is located over the first channel stop;
the sixth portion is located over the second channel stop;
the seventh portion is located over the first channel stop; and
the eighth portion is located over the second channel stop.

15. The sensor of claim 13, wherein in the first register element set:

the first portion is located over the first channel stop and a first part of the channel;
the second portion is located over the second channel stop and a second part of the channel;
the third portion is located over the first channel stop and a third part of the channel;
the fourth portion is located over the second channel stop and a fourth part of the channel;
the fifth portion is located over the first channel stop and a fifth part of the channel;
the sixth portion is located over the second channel stop and a sixth part of the channel;
the seventh portion is located over the first channel stop and a seventh part of the channel; and
the eighth portion is located over the second channel stop and an eighth part of the channel.

16. The sensor of claim 1, wherein:

the plurality of register element sets are ordered from an initial register element set to a final register element set;
a pixel reticulation area of the initial register element set is greater than the pixel reticulation area of the first register element set; and
the pixel reticulation area of the first register element set is greater than a pixel reticulation area of the final register element set.

17. The sensor of claim 1, wherein:

the plurality of register element sets are ordered from a first end register element set to a middle register element set to a second end register element set;
a pixel reticulation area of the first end register element set is less than the pixel reticulation area of the first register element set;
the pixel reticulation area of the first register element set is less than a pixel reticulation area of the middle register element set; and
the pixel reticulation area of the middle register element set is greater than a pixel reticulation area of the second end register element set.

18. The sensor of claim 1, wherein:

the bus structure further includes a predetermined number of diagonal buses;
the plurality of register element sets is organizable into a predetermined number of register element groups, each register element group including a plurality of register element sets;
the pixel reticulation area of the first register element set is equal to a pixel reticulation area of each other register element set in a register element group in which the first register element set belongs; and
the predetermined number of diagonal buses equals the predetermined number of register element groups.

19. The sensor of claim 1, wherein:

the bus structure further includes a predetermined number of diagonal buses;
the plurality of register element sets includes a final register element set;
a pixel length is defined to be a pixel pitch;
a gate area is defined to be the pixel length multiplied by a pixel width less a pixel reticulation area that corresponds to the final register element set;
a first ratio is defined to be twice the square of the pixel length divided by the gate area;
a difference is defined to be the first ratio less one of unity and three-halves;
a fraction is defined to be an area of a diagonal bus that is disposed over a reticulation hole divided by an area of the reticulation hole;
a denominator is defined to be the difference multiplied by the fraction;
a second ratio is defined to be a number of register element sets divided by the denominator;
the predetermined number of diagonal buses is a nearest integer to a square root of the second ratio that is evenly divisible into the number of register element sets.

20. A sensor comprising a column of pixels ordered from an initial pixel to a final pixel, wherein:

each pixel includes a plurality of reticulated conductors defining a reticulation area and a pixel charge handling capacity;
the reticulation area of a pixel increases from the final pixel to the initial pixel; and
the pixel charge handling capacity increases from the initial pixel to the final pixel.

21. The sensor of claim 20, wherein:

each reticulated conductor defines a photogate that is characterized by a respective photogate charge handling capacity; and
the pixel charge handling capacity of a pixel is defined to be the lowest photogate charge handling capacity of the photogates that correspond to the reticulated conductors of the pixel.

22. A sensor comprising:

a first bus structure of a first material; and
a second bus structure of a second material disposed substantially diagonally to the first bus structure, the second material being more conductive than the first material, the second bus structure including at least one clock bus set, each clock bus set including a plurality of bus conductors, a first bus conductor of a first clock bus set including a plurality of parallel segments, each parallel segment being co-parallel to the first bus structure.

23. The sensor of claim 22, wherein:

the first bus structure includes a plurality of register element sets, each register element set including a plurality of clock conductors;
a first clock conductor of a first register element set includes a first bridge segment adjacent to a first reticulation hole in the first clock conductor; and
a first parallel segment of the first bus conductor being disposed over the first bridge segment and connected thereto with a contact.

24. The sensor of claim 22, wherein:

the at least one clock bus set of the second bus structure includes plural clock bus sets;

the first bus structure includes a plurality of register element sets, each register element set including a plurality of clock conductors;

a first clock conductor of each register element set extends in an elongate direction and defines a predetermined clock conductor length in a direction perpendicular to the elongate direction;

the first clock conductor of each register element set includes a first bridge segment having a predetermined bridge segment length in the direction perpendicular to the elongate direction, the predetermined clock conductor length being greater than the predetermined bridge segment length;

a first parallel segment of the first bus conductor of each clock bus set is disposed over the first bridge segment of the first clock conductor of a corresponding set of the plurality of register element sets and connected thereto with a contact.

25. The sensor of claim 24, wherein:

the first bridge segment of the first clock conductor of each register element set defines a respective first reticulation hole characterized by a reticulation length equal to the predetermined clock conductor length less the predetermined bridge segment length; and a first reticulation area of the first reticulation hole in the first clock conductor of a first register element set is unequal to a first reticulation area of the first reticulation hole in the first clock conductor of another register element set.

26. The sensor of claim 25, wherein:

the first parallel segment of the first bus conductor of each clock bus set includes a first portion that is disposed over the first reticulation hole in the first clock conductor of the corresponding set of the plurality of register element sets, the first portion being characterized by a predetermined portion length in the direction perpendicular to the elongate direction; and the predetermined portion length of the first portion of the first parallel segment of the first bus conductor of a first clock bus set is equal to the predetermined portion length of the first portion of the first parallel segment of the first bus conductor of any other clock bus set.

* * * * *